(12) United States Patent
Yun

(10) Patent No.: US 6,566,751 B1
(45) Date of Patent: May 20, 2003

(54) CARRIER MODULE FOR HOLDING A μ-BGU TYPE DEVICE FOR TESTING

(75) Inventor: Sang Jae Yun, Kyungki-do (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 09/559,085

(22) Filed: Apr. 27, 2000

(30) Foreign Application Priority Data

May 1, 1999 (KR) .............................. 99-15800

(51) Int. Cl.$^7$ .................. G01R 31/02; G01R 31/26; H05K 7/20; B65D 73/02; B65D 85/86
(52) U.S. Cl. .................. 257/727; 257/726; 257/718; 257/719; 257/48; 257/697; 257/732; 257/731; 257/729; 206/725; 206/545; 206/815
(58) Field of Search .................. 257/738, 737, 257/727, 726, 718, 691, 719, 693, 487, 678, 702, 730, 48, 731, 729, 732, 697; 206/725, 545, 815

(56) References Cited

U.S. PATENT DOCUMENTS

| | | | |
|---|---|---|---|
| 5,848,702 A | * | 12/1998 | Pakeriasamy ............... 206/725 |
| 5,957,293 A | * | 9/1999 | Pakeriasamy ............... 206/725 |
| 6,018,465 A | * | 1/2000 | Borkar et al. ............... 361/825 |
| 6,078,500 A | * | 6/2000 | Beaman et al. ............. 257/706 |
| 6,137,688 A | * | 10/2000 | Borkar et al. ............... 257/727 |
| 6,179,127 B1 | * | 1/2001 | Kato et al. .................. 206/714 |
| 6,208,155 B1 | * | 3/2001 | Barabi et al. ............... 324/754 |
| 6,220,870 B1 | * | 4/2001 | Barabi et al. ................. 439/71 |
| 6,232,243 B1 | * | 5/2001 | Farnworth et al. .......... 438/763 |

FOREIGN PATENT DOCUMENTS

| | | | |
|---|---|---|---|
| JP | 2000-255628 | * | 9/2000 |
| JP | 2000-321328 | * | 11/2000 |

* cited by examiner

*Primary Examiner*—Alexander O. Williams
(74) *Attorney, Agent, or Firm*—Fleshner & Kim, LLP

(57) ABSTRACT

The present invention relates to a carrier module for micro-BGA(μ-BGA) type device which is capable of testing a produced device without damaging to a solder ball thereunder after being rapidly connected to a test socket. A carrier module for a μ-BGA type device according to the present invention comprises: an upper and lower carrier module body formed with protrusions at the upper and lower portions thereof; a device receiving unit inserted to the upper carrier module body for receiving a μ-BGA type device; and a spring secured elastically to the upper and lower protrusions by being inserted thereto.

9 Claims, 7 Drawing Sheets

CARRIER MODULE FOR HOLDING A μ-BGU TYPE DEVICE FOR TESTING

BACKGROUND OF THE INVENTION

1. Field of the Invention

The present invention relates to a carrier module for a μ-BGA type device which is capable of testing a produced device without damaging to a solder ball thereunder after being rapidly connected to a test socket.

2. Description of the Prior Art

In general, a produced device by a manufacturing process is fed to a test portion of a handler to be electrically connected a lead of device to a connector. Under this state, the device is tested by the tester and as the result of test, only a good device is outputted and a bad device is dropped.

A conventional micro-Ball Grid Array(μ-BGA) type device 1 is, as shown in FIGS. 1 and 2, very small its size by around 5×8 mm and is its bottom surface formed with a ball 2 having 0.3 mm of diameter as a lead. The pitch between the balls 2 is about 0.5 mm.

The devices having the above constructions are formed with a body 3 by a molding method considering a productivity and is as shown in FIG. 1 cut along a cutting line 4. Because the dimension of the outline of ball 2 is not constant, the difference of that can be allowed to 0.15 mm.

FIG. 3 shows a state that a conventional μ-BGA type device is connected to a contact pin of socket, and FIG. 4 shows a state that in a conventional contact apparatus, the ball is connected to a contact pin.

After an electronic device 1 served at a customer tray not shown is fed to an align block thereby to be determined a position therefor, the device 1 is sucked by a plurality of pickers 5 as a suction means thereby to be fed toward a socket 6.

At this time, when the ball 2 exposed in the lower direction of the device 1 is placed on the straight line to the contact pin 7, picker 5 descends toward the socket thereby to be connected the ball 2 to the pin 7 of the socket 6. Under this state, when the picker 5 further descends in the lower direction thereby to press the device 1, the ball 2 of device 1 is electrically contacted to the pin 7 so that an electrical property of device can be performed.

However, the conventional test apparatus having the above constructions has the problems in that because the ball 2 can not correctly contact to the contact pin 7 when the picker 5 descends, the good device is misjudged to be the bad device.

That is, the error operation like that can be occurred in case when the ball 2 is gone crisscross with the contact pin 7 although the picker 5 picks up the right position for the device 1 which the position is determined by the align block.

Therefore, misalignment between the ball and the pin owing to the pitch of ball 2 and an incorrect position can be occurred because the picker 5 directly holds a plurality of devices 1 thereby to be contacted to the pin 7.

Furthermore, because a test socket formed with a ball groove become thin its thickness and the pitch of ball, not only misalignment is occurred but also the ball is broken or distorted.

In resent days the test socket has been thinned in its thickness. This is because by shortening the distance between the device and the test socket, the noise or distortion can be reduced to the minimum. In case the test socket is manufactured to be thin its thickness the chamber of the test site should be its thickness thinned.

However, it can not be allowed to manufacture the chamber of test site to be thinned because an adiabatic effect can not be maintained going beyond the predetermined limit. Therefore, if the thickness of chamber of the test site is not thin the test tray provided with the device can not be easily contacted to the test socket. That is, the test for property of the device is not possible and many bad products occur although the test is accomplished.

Furthermore, the conventional carrier module maintains the pitch between the balls of the μ-BGA device to be constant, however, the pitch to the ball from the cut outline is random thereby to occur many errors.

Accordingly, the ball of μ-BGA device can not be correctly inserted to the ball groove of test socket and is contacted to the peripheral portions so that the ball of device is broken or distorted thereby to increase the error rate and to deteriorate a productivity.

SUMMARY OF THE INVENTION

Accordingly, the present invention has been invented to overcome the above problems and it is an object to provide a carrier module for a μ-BGA type device which is capable of performing precisely the test for property thereof in order to be increased a productivity by which a test socket is correctly contacted to a μ-BGA type device.

Another object of the present invention is to provide a carrier module for a μ-BGA type device in which a high-speed test can be performed by shortening a contact distance between a test socket and a device.

Still another object of the present invention is to provide a carrier module for a μ-BGA type device in which an apparatus can be small by minimizing a test socket to be shorten a contact distance between a test socket and a device.

In order to accomplish the above objects the present invention provides a carrier module for a μ-BGA type device comprising: an upper and lower carrier module body formed with protrusions at the upper and lower portions thereof; a device receiving unit inserted to the upper carrier module body for receiving a μ-BGA type device; and a spring secured elastically to the upper and lower protrusions by being inserted thereto.

The device receiving unit comprises a device receiving portion for receiving a μ-BGA type device; and a first guide and a second guide for guiding the device to the device receiving portion.

The second guide is provided with a fixing groove for fixing the device receiving unit to the carrier module.

The device receiving unit comprises a fixing bolt for being inserted to the fixing groove of the second guide to be concluded therewith; a silicon rubber for being inserted to the outer portion of the bolt and inserted to the fixing groove of the unit; and a fixing nut for being coupled to the bolt.

The fixing nut is inserted with the lower end of the silicon rubber which is inserted to the fixing groove of the device receiving unit to be coupled to the bolt.

The protrusions formed at the upper and lower carrier module bodies are formed to be across.

The spring is inserted between the upper protrusion and the lower protrusion to be wound to the upper and lower carrier module body.

The carrier module including an upper and lower carrier module body and wounding its around with the spring is mounted at the test tray provided with the mounting portion.

The test tray is constructed that the spring installed at the around of carrier module is inserted to the protrusions which are formed to be symmetrical to the carrier module mounting portion of the test tray and to move in forward and backward directions.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
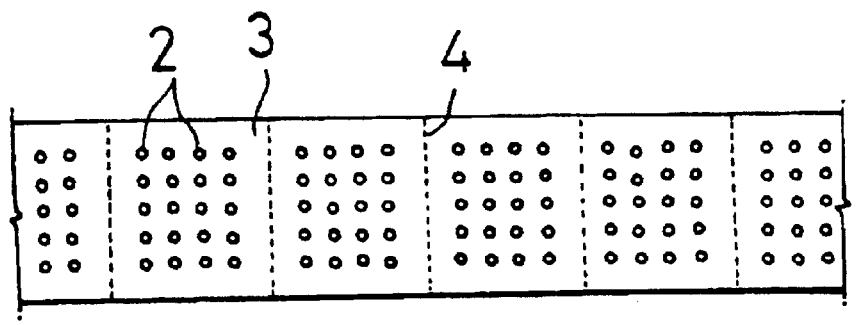
FIG. 1 is a plan view showing a state that a μ-BGA type device is molded.
Figure 2:
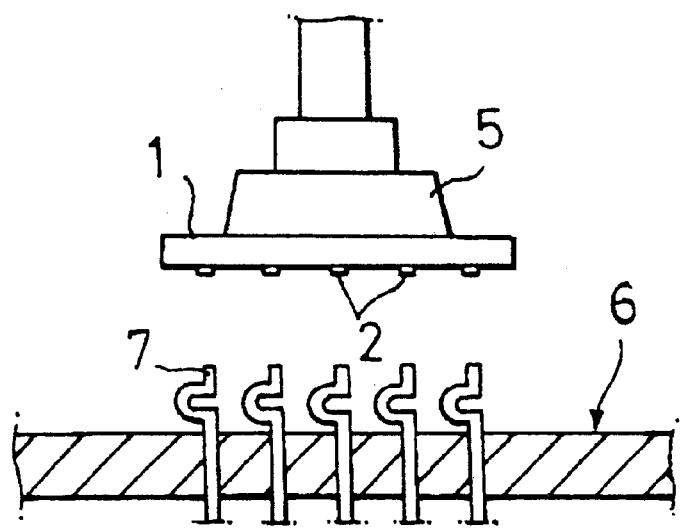
FIG. 2 shows a state before a conventional μ-BGA type device is connected to a contact pin of a socket.
Figure 3:
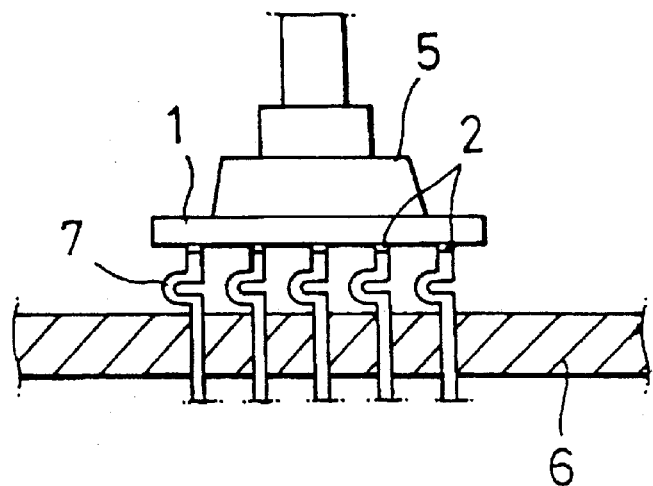
FIG. 3 shows a state that a conventional μ-BGA type device is connected to the contact pin of socket.
Figure 4:
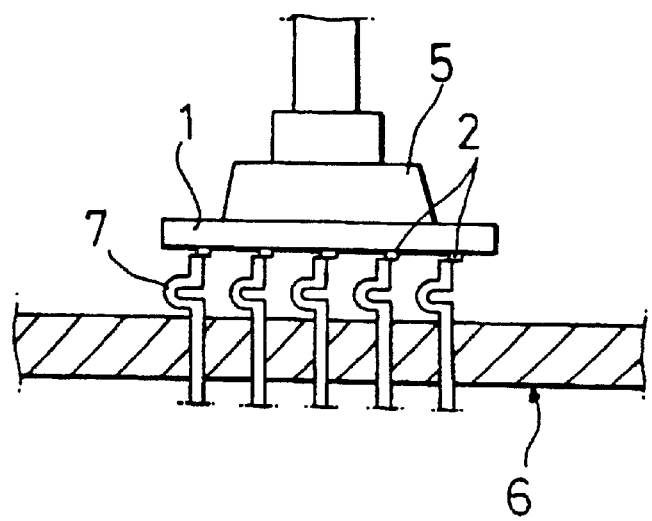
FIG. 4 shows a state that the ball of device is connected to the contact pin.
Figure 5:
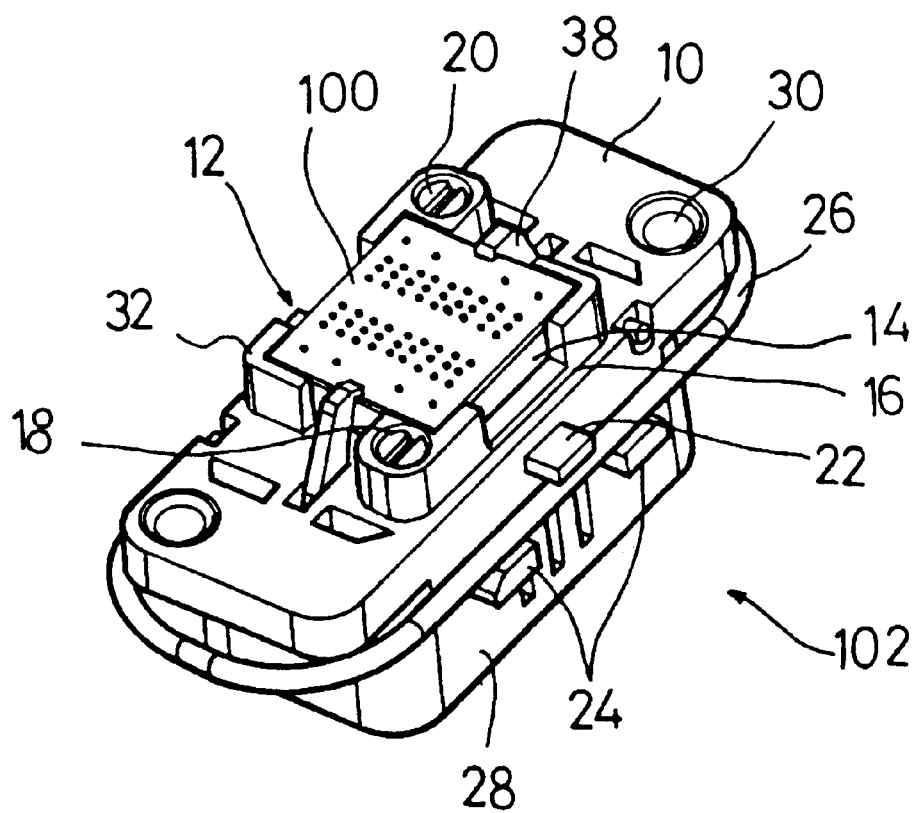
FIG. 5 is a perspective view of a carrier module for μ-BGA type device according to the present invention.
Figure 6:
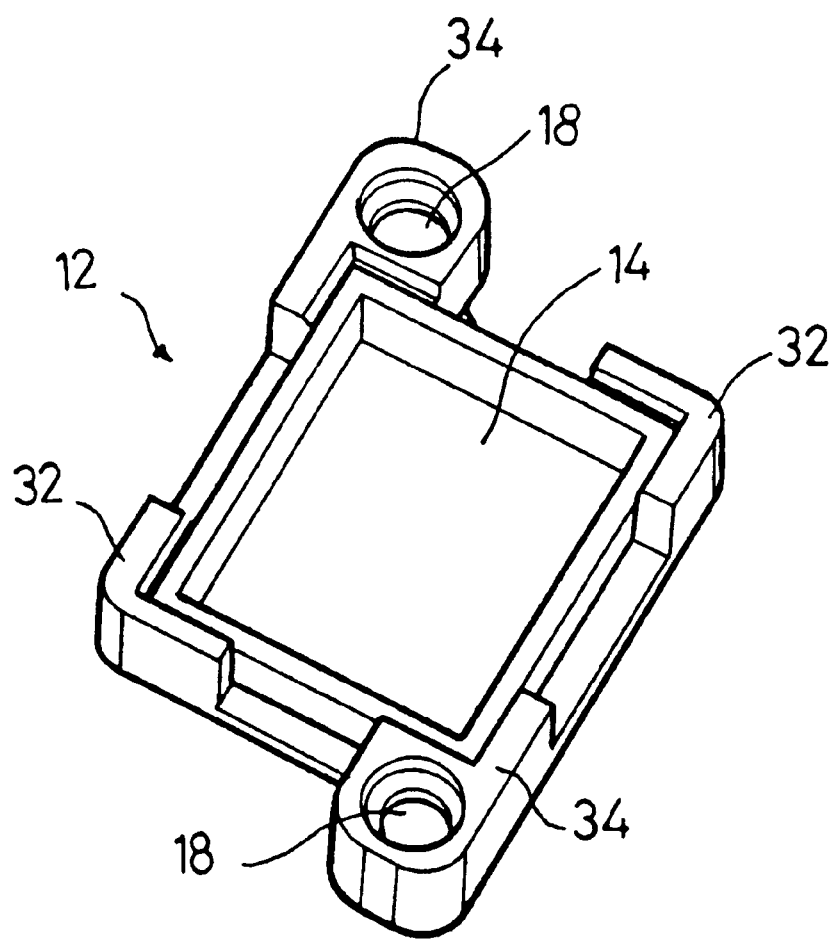
FIG. 6 is a perspective view of a device receiving unit of the carrier module according to the present invention.

FIG. 5 is a perspective view of a carrier module for μ-BGA type device according to the present invention and FIG. 6 is a perspective view of a device receiving unit of the carrier module according to the present invention.

A carrier module for a μ-BGA type device according to the present invention comprising: an upper and lower carrier module body 10 and 28 formed with protrusions 22 and 24 at the upper and lower portions thereof; a device receiving unit 12 for being inserted to the upper carrier module body 10 for receiving a μ-BGA type device; and a spring 26 secured elastically to the upper and lower protrusions 22 and 24 by being inserted thereto.

The device receiving unit 12 as shown in FIG. 6 comprises a device receiving portion 14 for receiving a μ-BGA type device; and a first guide and a second guide 32 and 34 for guiding the device to the device receiving portion 14.

The second guide 34 is provided with a fixing groove 18 for fixing the device receiving unit 12 to the carrier module 102.

Figure 7:
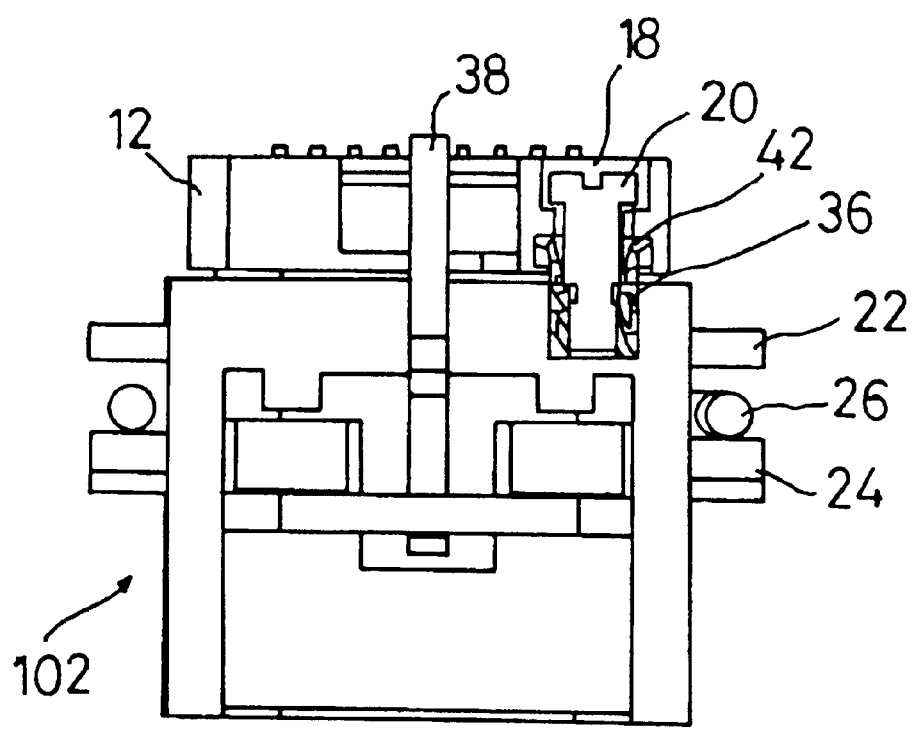
FIG. 7 is a sectional view of the carrier module according to the present invention.

The device receiving unit 12 as shown in FIG. 7 comprises a fixing bolt 20 for being inserted to the fixing groove 18 of the second guide 34 to be coupled therewith; a silicon rubber 42 for being inserted to the outer portion of the bolt 20 and inserted to the fixing groove 18 of the unit 12; and a fixing nut 36 for being coupled to the bolt 20.

The fixing nut 36 is inserted with the lower end of the silicon rubber 42 which is inserted to the fixing groove 18 of the device receiving unit 12 to be coupled to the bolt 20.

The protrusions 22 and 24 formed at the upper and lower carrier module bodies 10 and 28 are formed to be across.

The spring 26 is inserted between the upper protrusion 22 and the lower protrusion 24 to be wound to the upper and lower carrier module body 10 and 28.

Figure 8:
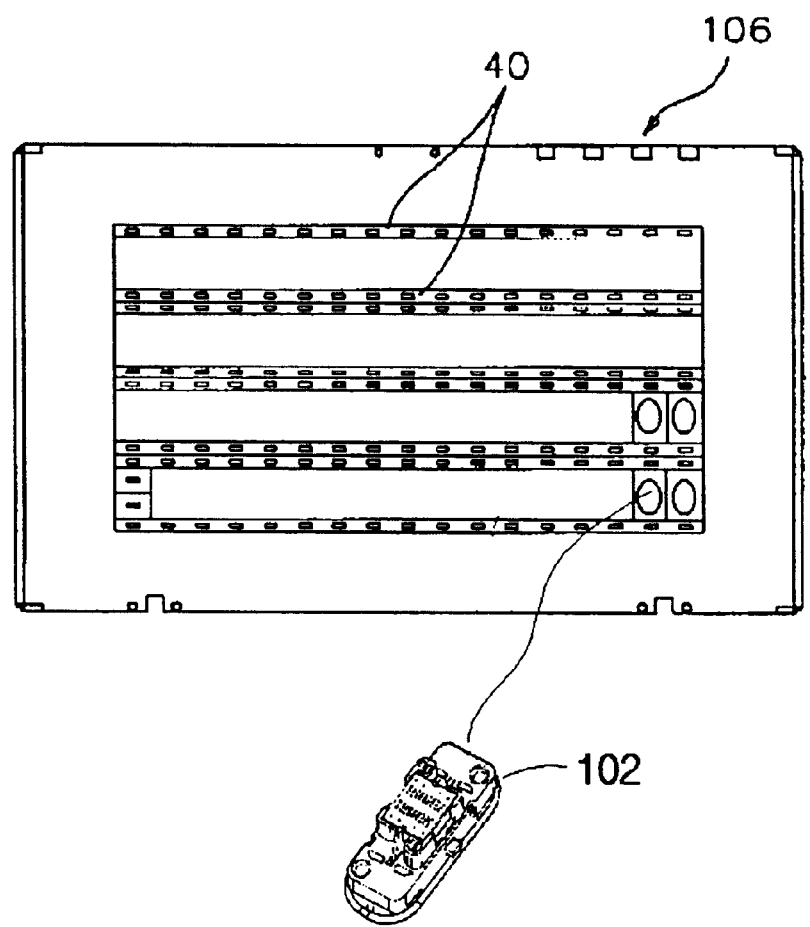
FIG. 8 is a plan view of the test tray mounted with the carrier module according to the present invention.
Figure 9:
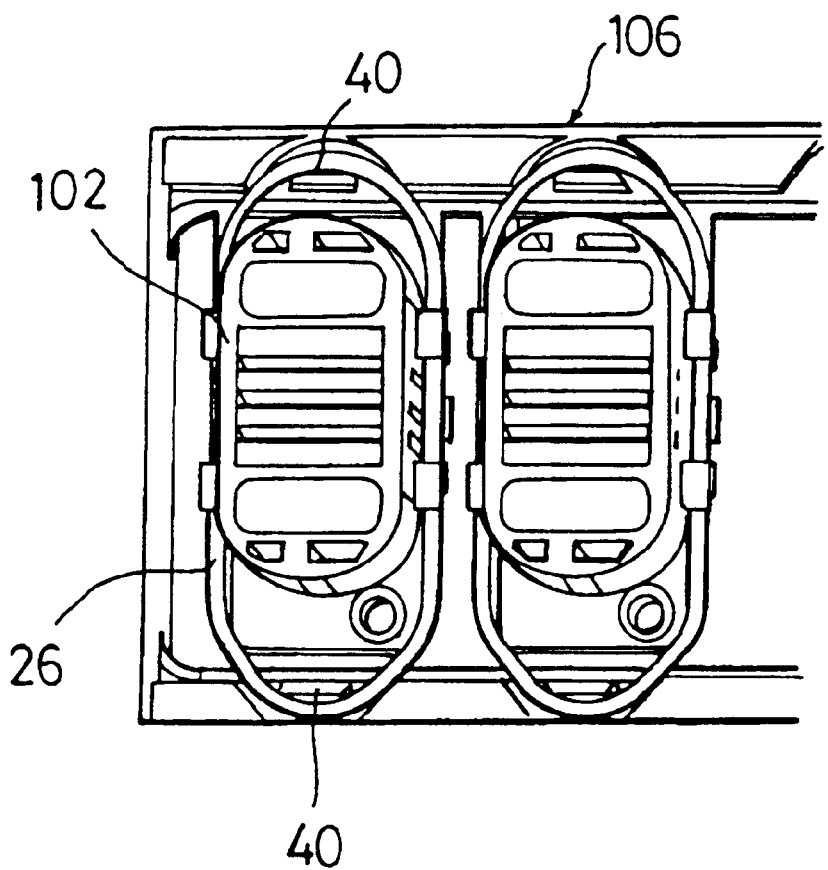
FIG. 9 is an enlarged view of the test tray when the carrier module is mounted.

The carrier module 102 as shown in FIGS. 8 and 9 including an upper and lower carrier module body 10 and 28 and wounding its around with the spring 26 is mounted at the test tray 106 provided with the mounting portion.

The test tray 106 is constructed that the spring 26 installed at the around of carrier module 102 is inserted to the protrusions 22 and 24 which are formed to be symmetrical to the carrier module mounting portion of the test tray and to move in forward and backward directions.

More detailed descriptions for the carrier module 102 according to the present invention will follows.

The carrier module 102 is at its upper and lower portions formed with the upper body 10 and the lower body 28. The upper body 10 is at its one edge formed with the position determining groove 30 for combining with the position determining pin of the test socket not shown and is at its central portion formed with the inserting groove 16 for being inserted the device receiving unit 12.

The upper protrusions 22 are formed at the left and right portions of the upper body 10 of the carrier module 102 to be symmetrical, and the lower protrusions 24 are formed at the left and right portions of the lower body 28 of the carrier module 102. The spring 26 is inserted to the upper and lower protrusions 22 and 24 and installed at the peripheral surface of the carrier module 102. Furthermore, the inserting groove 16 is inserted with the device receiving unit 12 which is received with the μ-BGA device 100. The μ-BGA device 100 is its front and back portions secured by the latch 38 installed at the carrier module 102.

The device receiving unit 12 is formed with the first guide 32 at both edges thereby to fix the μ-BGA device 100 and at its opposite edge formed with the second guide 34 which is formed with the fixing groove 18.

The fixing groove 18 of second guide 34 is inserted with the fixing nut not shown. At this time, the nut is coupled with the bolt 20 so, that the device receiving unit 12 is fixed to the carrier module 102.

FIG. 7 is a sectional view of the carrier module 102 inserted with the μ-BGA device 100.

The carrier module 102 is received with the μ-BGA device 100. The fixing groove 18 formed at the carrier module upper and lower body 10 and 28 is inserted with the silicon rubber 42 and at its lower portion inserted with the nut 36 to be coupled to the bolt 36.

At this time, although the bolt 20 is coupled to the nut 36, the silicon rubber 42 is its lower end inserted to the nut 36 thereby to move in left, right, forward and backward directions because the silicon rubber 42 is elastic.

The μ-BGA device 100 is its one side secured by the latch 38 and the spring 26 is inserted between the protrusions 22 and 24 so that the carrier module 102 mounted at the test tray not shown moves elastically to be coupled to the test socket.

The test tray 106 as shown in FIGS. 8 and 9, is provided with the mounting portions for mounting the carrier module 102 and each mounting portion for the carrier module 102 is at its both side formed with the protrusions so that the spring installed at the peripheral surface of the carrier module 102 is locked thereto.

The produced μ-BGA device 100 is received at the device receiving unit 12 of the carrier module thereby to be fixed by the latch 38 and the spring 26 is inserted between the upper protrusion 22 and the lower protrusion 24.

The carrier module 102 received with the μ-BGA device 100 is mounted at the test tray 106 thereby to be fed to the test socket of test site for testing. At this time, the spring 26, which is inserted to the upper and lower protrusions 22 and 14, is inserted to the protrusion 40.

The carrier module 102 installed at the test tray 106 can be perfectly contacted to the test socket by an elastic force of the spring 26 although the test socket become thin its thickness. Therefore, the apparatus can become small.

In order to be correctly inserted the ball of the μ-BGA device 100 to the groove of the test socket, the fixing groove 18 of the device receiving unit 12 is inserted with the silicon rubber 42 and the lower end of the silicon rubber 42 is inserted to the nut 36 to be coupled to the bolt 20. At this time, at the upper portion of the nut 36 is a small gap A is formed so that the device receiving unit 12 can move. Therefore, the ball of the μ-BGA device 100 can be inserted to the groove of the test socket.

As the foregoing description, the carrier module according to the present invention comprises the upper and lower carrier module body 10 and 28 and the device receiving unit 12 for being inserted to the upper portion of the upper and lower carrier module body 22 and 24 and can comply with the trend that the test socket is manufactured to become thin so that the apparatus can become small.

Furthermore, because the ball of the μ-BGA device 100 can be easily moved thereby to increase a contact performance and to increase a test efficiency.

As the foregoing description, the present invention can provide a carrier module for a μ-BGA type device which is capable of performing precisely the test for property thereof in order to be increased a productivity by which a test socket is correctly contacted to a μ-BGA type device.

Furthermore, the present invention can provide a carrier module for a μ-BGA type device in which a high-speed test can be performed by shortening a contact distance between a test socket and a device.

Further, the present invention can provide a carrier module for a μ-BGA type device in which an apparatus can be small by minimizing a test socket to be shorten a contact distance between a test socket and a device.

Having described specific preferred embodiment of the invention with reference to the accompanying drawings, it is to be understood that various changes and modifications may be effected therein by one skilled in the art without departing from the scope or spirit of the invention as defined in the appended claims.

What is claimed is:

1. A carrier module for a μ-BGA (micro-ball grid array) type device, comprising:

an upper carrier module body, wherein protrusions are formed on sides of the upper carrier module body;

a lower carrier module body, wherein protrusions are formed on sides of the lower carrier module body;

a device receiving unit mounted on the upper carrier module body; and a spring mounted on the carrier module between the protrusions on the upper carrier module body and the protrusions on the lower carrier module body.

2. The carrier module of claim 1, wherein the device receiving unit comprises a plurality of device guides configured to hold a μ-BGA device in a mounting position on the device receiving unit.

3. The carrier module of claim 1, wherein the device receiving unit is movably mounted on the upper carrier module body.

4. The carrier module of claim 1, wherein the device receiving unit is mounted on the upper carrier module body with at least one fastener, and wherein the at least one fastener is surrounded with an elastic material such that the device receiving unit is movable with respect to the upper carrier module body.

5. The carrier module of claim 4, wherein the fastener comprises a threaded fastener that passes through the device receiving unit and that is screwed into receiving threads on the upper carrier module body, and wherein the elastic material comprises silicon rubber interposed between the threaded fastener and the device receiving unit.

6. The carrier module of claim 1, further comprising at least one latch member mounted on the upper carrier module body and configured to hold a μ-BGA device in a mounting position in the device receiving unit.

7. The carrier module of claim 6, wherein the latch member is configured to contact a top surface portion of a μ-BGA device to hold the μ-BGA device in the mounting position in the device receiving unit.

8. The carrier module of claim 1, wherein the spring is configured to be mounted on protrusions of a test tray.

9. The carrier module of claim 8, wherein the protrusions on the upper carrier module body, the protrusions on the lower carrier module body, and the spring are all configured such that when the spring of the carrier module is mounted on protrusions on a test tray, the carrier module can move with respect to the test tray without causing the spring to disengage from the protrusions on the test tray.

* * * * *